United States Patent [19]

Kang et al.

[11] Patent Number: 5,146,425
[45] Date of Patent: Sep. 8, 1992

[54] MIST TYPE DYNAMIC RANDOM ACCESS MEMORY CELL AND FORMATION PROCESS THEREOF

[75] Inventors: Youngtae Kang; Laeku Kang, both of Seoul, Rep. of Korea

[73] Assignee: Samsung Electronics Co., Ltd., Suwon, Rep. of Korea

[21] Appl. No.: 720,947

[22] Filed: Jun. 25, 1991

Related U.S. Application Data

[62] Division of Ser. No. 635,728, Dec. 28, 1990.

[30] Foreign Application Priority Data

Oct. 11, 1990 [KR] Rep. of Korea .............. 90-16121[U]

[51] Int. Cl.⁵ ............................................. G11C 11/24
[52] U.S. Cl. ..................................... 365/149; 365/150
[58] Field of Search ................... 365/149, 150, 189.03, 365/226

[56] References Cited

U.S. PATENT DOCUMENTS

Re. 33,261  7/1990  Baglee et al. ................. 365/149

*Primary Examiner*—Terrell W. Fears
*Attorney, Agent, or Firm*—Christie, Parker & Hale

[57] ABSTRACT

A dynamic random access memory cell having a mixed trenched stacked capacitor, and a formation process therefor are disclosed. The punch-through phenomenon is prevented by providing a difference between the trench depths of the trenched capacitors. The insufficient capacitance of the capacitor having a shallower trench is compensated by making the area of the electrode of the stacked capacitor larger than the area of the electrode of the stacked capacitor of the memory cell having a deeper trenched capacitor. Thus, the coupling phenomenon liable to occur between the stacked capacitors can be prevented, thereby providing a DRAM cell applicable to a ultra large scale integrated circuit.

2 Claims, 4 Drawing Sheets first memory cell
second memory cell storage electrode second memory cell    third memory cell first memory cell

MIST TYPE DYNAMIC RANDOM ACCESS MEMORY CELL AND FORMATION PROCESS THEREOF

This is a division of application Ser. No. 07/635,728 filed on Dec. 28, 1990.

BACKGROUND OF THE INVENTION

(1) Field of the Invention

The present invention relates to a dynamic random access memory cell and a formation process thereof, and more particularly to a dynamic random access memory cell and a formation process thereof, in which a mixed stacked trench (MIST) type capacitor is provided.

(2) Description of the Prior Art

In the technical field of semiconductor memories, efforts have been focused on increasing the number of memory cells. For this purpose, it is important to minimize the area of each cell of the memory cell array formed on a chip which has a limited area.

It is therefore well known that providing one transistor and one capacitor in a memory cell in the smallest possible area is desirable. However, in a 1-transistor/1-capacitor cell, the capacitor occupies the most part of the area. Therefore, it is important that the area occupied by the capacitor is minimized, and at the same time, the capacitance of the capacitor is maximized, thereby making it possible to detect the stored data with a great reliability, so as to reduce the soft errors due to alpha particles.

In minimizing the occupation area of the capacitor and in maximizing the capacitance, a trench type capacitor is proposed. This trench type capacitor is constituted such that a cylindrical well is formed on the surface of the chip, and the capacitor electrode consists of the wall of the cylindrical well. Such a conventional trench type capacitor is disclosed in IEDM85 (pp 710-713, 1985) (International Electron Devices Meeting).

The trench type capacitor is formed in the following manner: a wafer in which an epitaxial layer is grown on a high concentration P+ substrate is used, and a cylindrical well is formed into the high concentration P+ layer. Then an insulating layer is formed on the wall of the well, and n+ polysilicon is filled into it, and a connection is formed to the source region of the transistor thereafter.

However, in forming the above described trench type capacitor, the thickness of the epitaxial layer is several micrometers and, therefore, the depth of the trench has to be deep enough to obtain a proper value of the capacitance, i.e., a value of capacitance suitable for the operation of the DRAM cell. Further, a thin oxide layer is formed on the wall of the trench, but, due to the sharpness of the corners of the bottom of the trench, the insulating layer can be damaged by the voltage supplied to the polysilicon which is filled into the trench for serving as the electrode of the capacitor. In addition, when the voltage on the polysilicon layer is varied, a strong inversion layer is formed between the above mentioned low concentration layer and the surface of the wall, thereby causing a punch-through phenomenon on the adjacent capacitors.

Another technique for maximizing the capacitance with the limited memory cell has been proposed which is disclosed in pages 31 through 34 of IEDM (International Electron Devices Meeting) (S. Inoue et. al.) of 1989. This is a DRAM cell using a stacked capacitor (STC), and the description also includes a spread stacked capacitor (SSC) which is an improvement over the stacked capacitor.

The conventional techniques mentioned previously are described in FIGS. 3 and 4. FIG. 3 is a sectional view of a DRAM cell having a stacked capacitor, and in this DRAM cell, $SiO_2$ is eliminated in order to simplify the structure of the memory cell. Here, reference numeral 21 indicates a storage electrode, 22 is a word line, and 23 is a field oxide layer.

As shown in the drawing, the storage electrode 21 of this DRAM cell uses only its own one memory cell region, and therefore, it cannot provide a sufficient storage capacitance within its limited own cell region for a memory device having a large capacity of over 16M bits.

FIG. 4 illustrates a structure in which each of storage electrodes 31, 32, 33 occupies two memory cell regions, thereby doubling the storage capacitance of the STC type memory cell of FIG. 3. In FIG. 4, reference numeral 31 indicates a storage electrode of a first memory cell; 32 is a storage electrode of a second memory cell; 33 is a storage electrode of a third memory cell; 34 is a bit line; 35 is a common drain region; 36 and 37 are word lines to serve as the gate electrodes; 38 and 39 are source electrodes, and 40 is a field oxide layer.

As shown in FIG. 4, the two memory cells, i.e., the first and second memory cells are formed between the field oxide layers 40. The spread stacked storage electrode 31 of the first memory cell is formed in such a manner that, in the vertical direction, it is extended between the bit line 34 and the storage electrode 32 of the second memory cell, and in the lengthwise direction, it is extended over a length equivalent to the two memory cell regions formed between the second storage electrode 32 and the third storage electrode 33.

In this arrangement, the storage capacitance Cs is greatly increased because it is proportionate to the area, but the distance between the first storage electrode 31 and the second storage electrode 32 and the third storage electrode 33 becomes too short, thereby causing the coupling of the electrodes to become too close, and consequently, causing disturbances in the stack structure.

SUMMARY OF THE INVENTION

The present invention is intended to overcome the above-described disadvantages of the conventional techniques. That is, the present invention is intended to overcome the problems of the punch-through phenomenon and the coupling phenomenon occurring in the trenched capacitor and the stacked capacitor, respectively.

The intersections between electrodes have to be reduced as far as possible if the coupling phenomenon between the storage electrodes is to be reduced. Further, the step difference has to be reduced, and the trench type has to be used if the intersections between electrodes are to be reduced, and if the capacitance is to be increased. Further, in using the trench, the depth of the trench is modified in order to reduce the current leakage due to the punch-through.

Therefore, it is an object of the present invention to provide a DRAM cell and a formation process therefor, which embodies a mixed stacked trenched capacitor.

It is another object of the present invention to provide a capacitor structure having a storage capacitance sufficient to be applied to an ultra large scale integrated circuit (ULSI).

In achieving the above objects, according to one aspect of the present invention, a dynamic random access memory cell is provided having a single transistor and a single capacitor, and is characterized in that: the capacitor comprises a trenched capacitor, and stacked capacitor having a vertical relation to the trenched capacitor and formed on the position of the transistor. The depth of the trench of the trenched capacitor is designed to be different from the depth of the trenched capacitor of the adjacent memory cell and the area of the stacked capacitor of the first memory cell has a shallow trenched capacitor which is designed to be larger than the area of the electrode of the stacked capacitor of an adjacent second memory cell having a deeper trenched capacitor.

According to another aspect of the present invention, a formation process is provided for the DRAM cell having a single transistor and a single capacitor and having mixed trenched and stacked structure, which comprises: forming a first trench of a required depth using a first mask when forming the trenched capacitor; forming a second trench having a deeper trench relative to the first trench using a second mask; and forming a stacked capacitor.

In the step of forming the stacked capacitor, the area of a first storage electrode of the first memory cell stacked capacitor having the first trenched capacitor is designed to be larger than the area of a second storage electrode of the second memory cell stacked capacitor having the second trenched capacitor.

BRIEF DESCRIPTION OF THE DRAWINGS

The objects and advantages of the present invention will become more apparent by the following description of the preferred embodiments of the present invention with reference to the accompanying drawings in which is shown in FIG. 1A a field oxide layer 2 on a P type silicon substrate by applying the ordinary method. FIG. 1A illustrates the step of defining an active region and an inactive region conventionally carried out by growing a full oxide layer 2 on a P-type silicon substrate.

FIG. 1B illustrates a step in which a gate insulating layer 3 is formed by applying a thermal oxidation method, and then, polysilicon is spread (i.e., deposited) in the thickness of 2000 . Thereafter a patterning is carried out in such a manner that two memory cells should be assigned per active region, thereby forming two gate electrodes 4, the rest of the portion being subsequently removed.

Figure 1A:
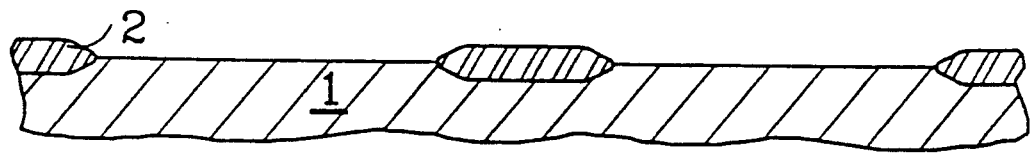
FIG. 1A-FIG. 1J are schematic vertical elevational views, partly in section, showing the formation process of the invention, in particular, a DRAM cell having a MIST type capacitor according to an embodiment of the present invention.
Figure 1B:
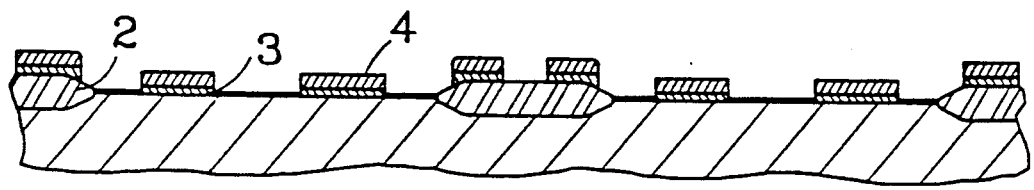
Figure 1C:
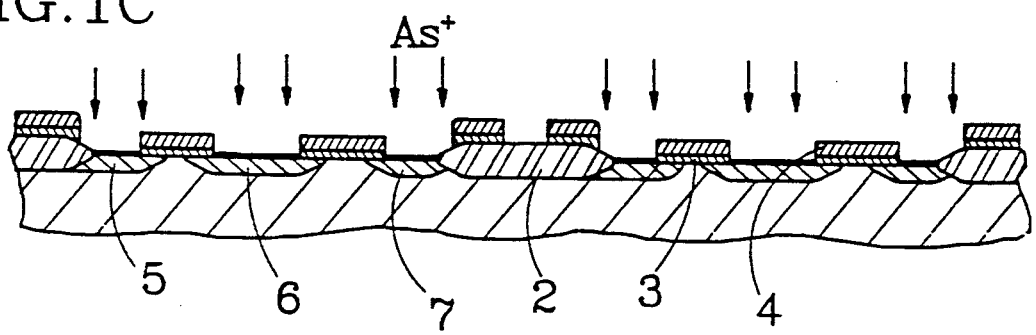

Then, as shown in FIG. 1C, a first memory cell source region 5, a common drain region 6 and a second memory cell source region 7 are formed in such a manner that an arsenic ion implantation in the rate of $4 \times 10^{15}$ atoms/cm$^2$ with and energy of 40 KeV is carried out to form the sources and the common drain.

Figure 1D:
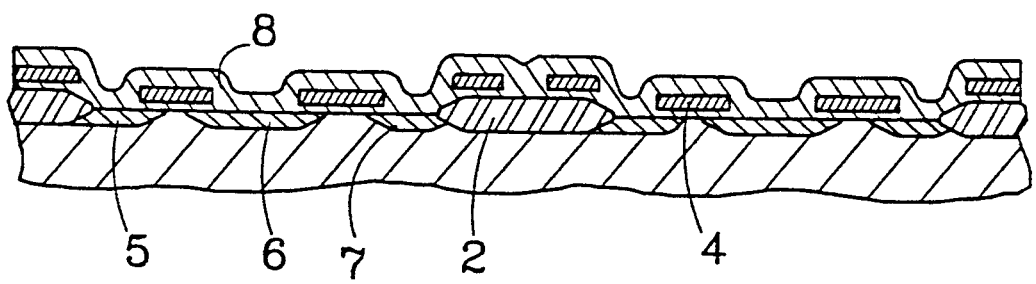

FIG. 1D illustrates a step of spreading a first insulating layer 8 upon the structure obtained through the step of FIG. 1C, and in this step, $SiO_2$ is spread in the thickness of 1000 Å and in the form of an HTO (high temperature oxidation) layer.

Figure 1E:
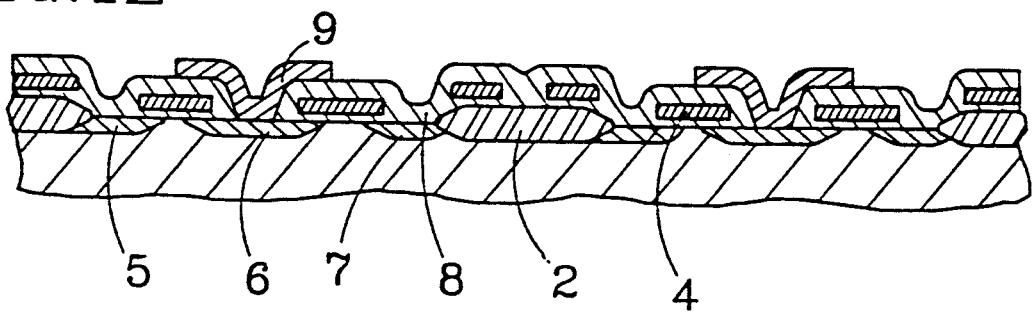

FIG. 1E illustrates a step of forming a bit-line 9 by spreading polysilicon in the thickness of 500 Å, and by carrying out a patterning.

Figure 1F:
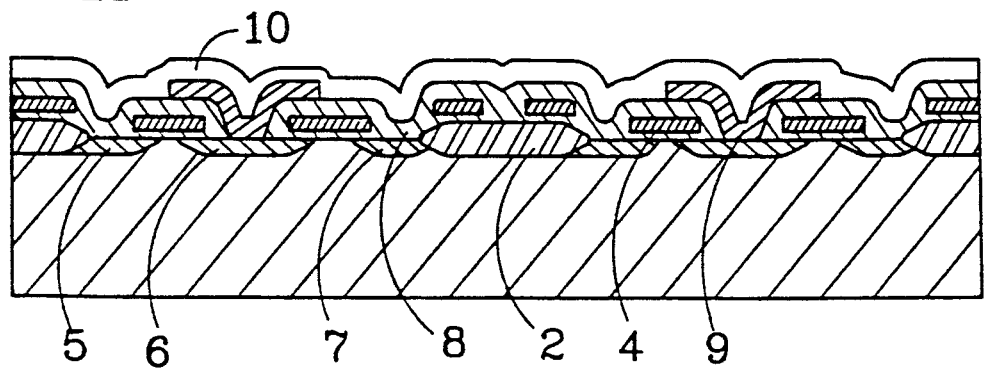

FIG. 1F illustrates a step of forming a second insulating layer 10 on the structure obtained through the step of FIG. 1E. The layer 10 is formed in the thickness of 2000 Å and in the form of an HTO layer.

Figure 1G:
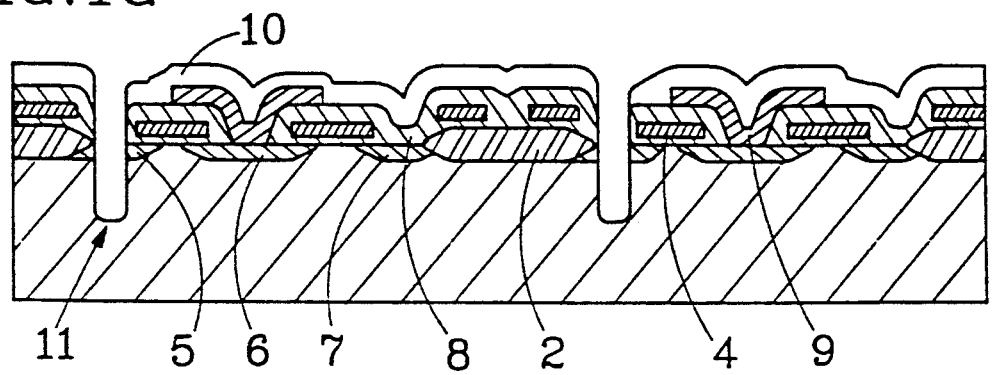

FIG. 1G illustrates a step of forming a first trench 11 having shallow depth. Specifically, a first exposure is made using a first trench mask in order to form a trench through the source region 5 of the left first memory cell among the two memory cells disposed on the first active region. Before carrying out the first exposure, a photoresist layer is spread on the surface of the second insulating layer 10. Thereafter, a reactive ion etching (RIE) is carried out to form a second insulating layer 10, a first insulating layer 8 and a gate insulating layer 3, in such a manner that insulating layer surrounding the gate4is not etched. The same kind of etching is successively carried out, that is, the source region 5 and the P type silicon substrate 1 are etched to form a first trench 11, the photoresist remaining on the substrate being removed therefrom.

Figure 1H:
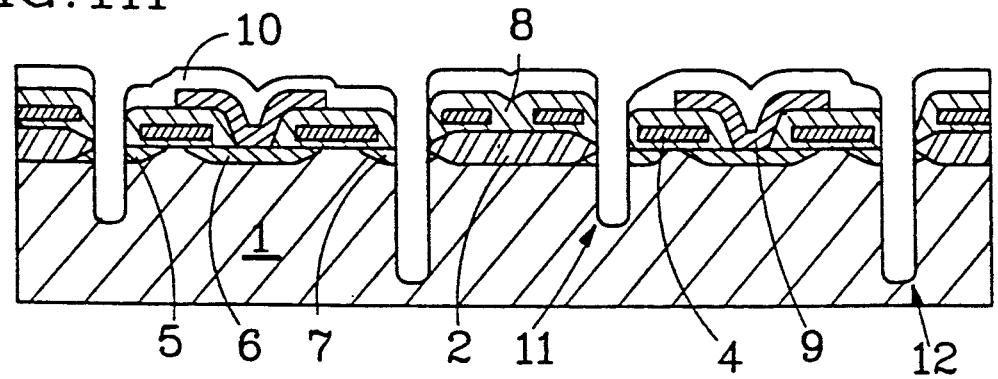

FIG. 1H illustrates a step of forming a second trench 12, and this step is carried out in the same manner as that of FIG. 1G, except that a second trench mask is used so that the trench is formed only through the source region 7 of the right second memory cell, and except that the etching time is controlled so that the depth of the second trench 12 is deeper than that of the first trench 11.

The trench forming steps of FIGS. 1G and 1H can be finished in a single process by forming in advance the step difference on the portion where the trench is to be formed.

Figure 1I:
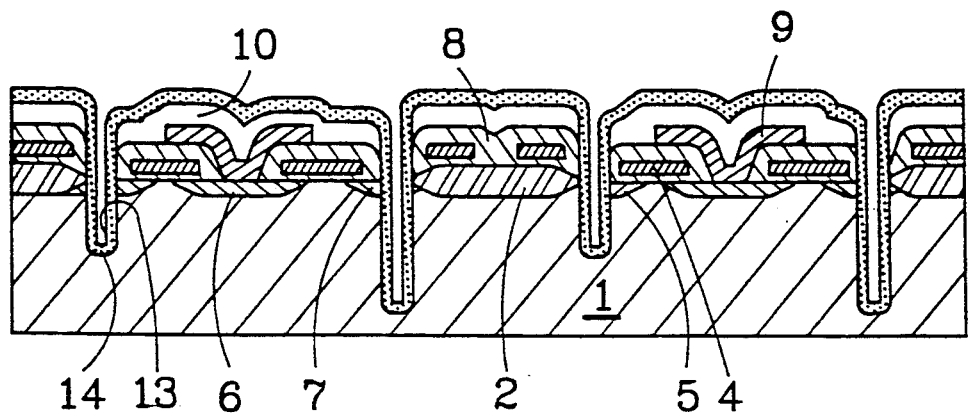

FIG. 1I illustrates a step of forming a first electrode of the capacitor. This step is carried out in such a manner that an insulating layer 13 consisting of a silicon oxide layer is formed on the insides of the trenches 11, and 12, formed through the step of FIG. 1H; a polysilicon layer 14 to serve as the first electrode of the capacitor is deposited by a CVD method; and then, a first electrode material is formed by dipping the obtained device into POCl$_3$ to diffuse phosphorus or implant a phosphorus or arsenic ion into the polysilicon layer 14.

Figure 1J:
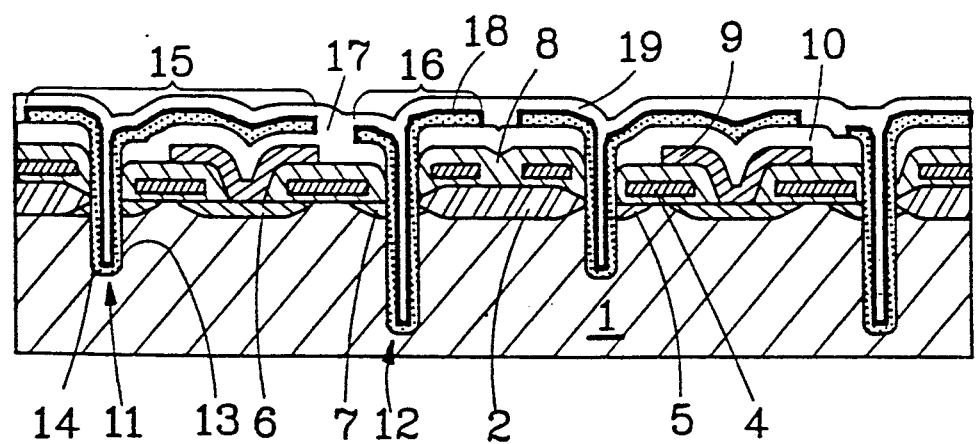

FIG. 1J illustrates a step of forming a stacked storage electrode, and this step is carried out in such a manner that the right portion of a storage electrode 15 of the stacked capacitor is allowed to extend in an elongate form up to the upper portion of the gate electrode 3 of the second memory cell in order to compensate for the insufficient storage capacitance of the first memory cell having a shallow trench depth; and, so that the second memory cell has a sufficient trench depth, the polysilicon layer 14 is patterned in such a manner as to form the left portion of a storage electrode 16 of the stacked capacitor in a short form, thereby forming a contact opening 17, and to separate the storage electrodes.

Thereafter, an insulating layer 18 made of dielectric substance having high dielectric constant and comprising $SiO_2$ or $SiO_2$, $Si_3N_4$ and $SiO_2$ (so called ONO) films is formed on the first electrode. On the whole surface of the structure including the insulating layer 18, there is grown a polysilicon layer 19 to serve as the second electrode, and dipped into $POCl_3$ to diffuse phosphorus, thereby forming a second electrode material.

The DRAM cell having the mixed stacked and trenched capacitors according to the present invention is manufactured through the process described above.

Figure 2:
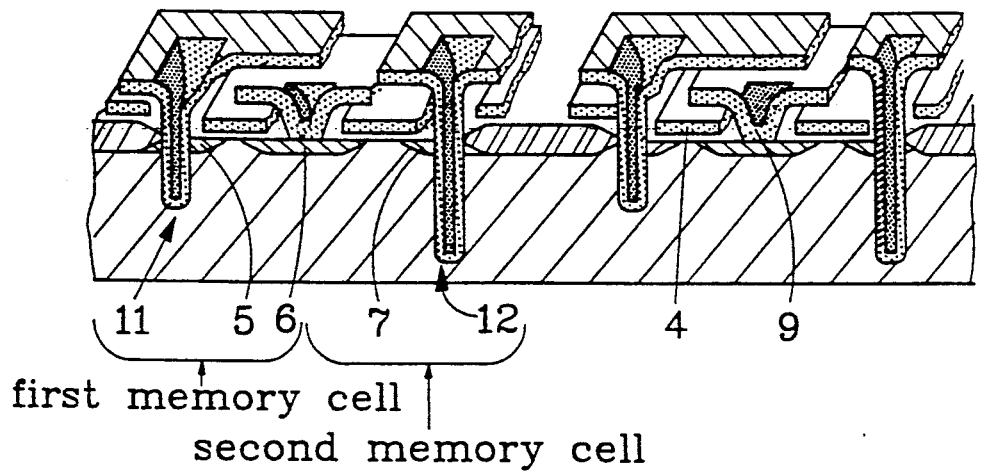
FIG. 2 is a schematic vertical elevational view, partly in section, showing the completed MIST type DRAM cell of the invention in which $S_iO_2$ is removed.
Figure 3:
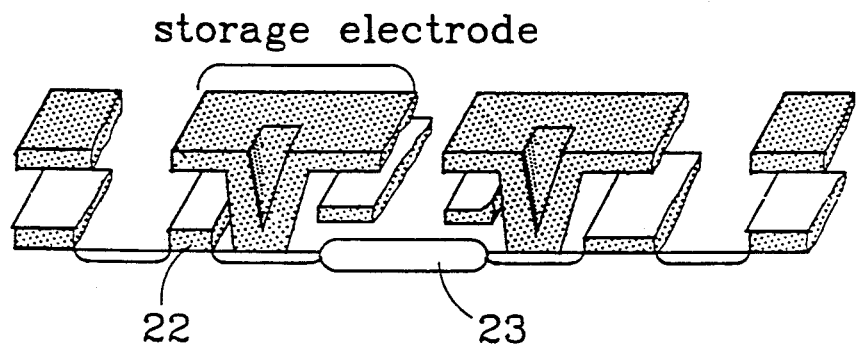
FIGS. 3 and 4 are partly sectional perspective views of the prior art, in particular, a DRAM cell having a conventional stacked capacitor and a conventional spread stacked capacitor, respectively, in which $S_iO_2$ is removed.
Figure 4:
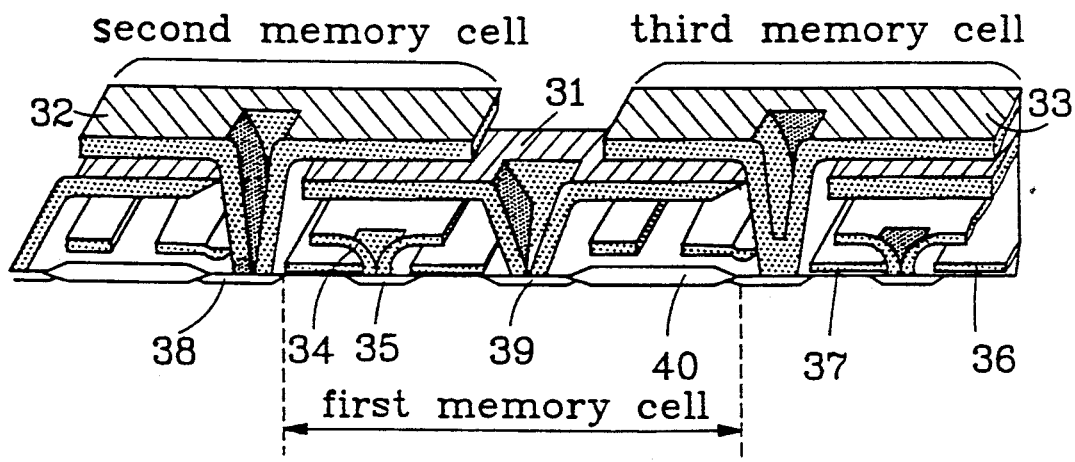

A partly sectional perspective view showing a state in which the insulating layer is removed from the completed DRAM cell is illustrated in FIG. 2. As can be clearly seen in this drawing, the DRAM cell of the present invention is constituted such that the depths of the trenches of the adjacent memory cells are different. Accordingly, the punch-through phenomenon which is liable to occur between the adjacent memory cells can be inhibited, and the capacitance of the capacitor having a shallower trench depth can be compensated relative to that of the capacitor having a deeper trench depth by means of a larger capacitor area. Further, in this case, the compensation of the capacitance is achieved without the existence of a step difference and overlapping; therefore, no coupling between adjacent storage electrodes occurs.

What is claimed is:

1. A dynamic random access memory cell (DRAM) in an array of cells, said DRAM having a single transistor and a single capacitor,
    said capacitor comprising a trenched capacitor formed in the shape of a trench and a stacked capacitor having a vertical differential in relation to said trenched capacitor and formed at the place where said transistor is to be formed;
    the depth of said trenched capacitor being different than the depth of the trenched capacitor of an adjacent memory cell, and
    said cell having a stacked capacitor with a shallower trench depth and being provided with a larger electrode area than that of the capacitor of an adjacent memory cell.

2. The dynamic random access memory cell as claimed in claim 1, wherein a pair of memory cells consisting of a first memory cell with a capacitor having a shallower trench depth and a larger electrode area and a second memory cell with a capacitor having a deeper trench depth and a smaller electrode area are disposed within an active region.

* * * * *

UNITED STATES PATENT AND TRADEMARK OFFICE
CERTIFICATE OF CORRECTION

PATENT NO. : 5,146,425
DATED      : September 8, 1992
INVENTOR(S) : Youngtae Kang; Laeku Kang It is certified that error appears in the above-identified patent and that said Letters Patent is hereby corrected as shown below:

Abstract, line 3, change "therefor" to -- therefore --.
Abstract, line 13, before "ultra" change "a" to -- an --.

Column 3, line 2, change "therefor" to -- therefore --.
Column 3, line 66, change "2000" to -- 2000A --.

Column 4, line 7, change "4x10$^{15}$" to -- 5x10$^{15}$ --.
Column 4, line 32, change "gate4is" to -- gate 4 is --.
Column 4, line 57, change "POCI$_3$" to -- POCl$_3$ --.

Signed and Sealed this

Twenty-sixth Day of October, 1993

Attest:

BRUCE LEHMAN

*Attesting Officer*      *Commissioner of Patents and Trademarks*